United States Patent
Nakanishi et al.

(10) Patent No.: US 12,482,660 B2
(45) Date of Patent: Nov. 25, 2025

(54) SEMICONDUCTOR DEVICE AND METHOD OF MANUFACTURING THE SAME

(71) Applicant: RENESAS ELECTRONICS CORPORATION, Tokyo (JP)

(72) Inventors: Sho Nakanishi, Tokyo (JP); Kodai Ozawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 445 days.

(21) Appl. No.: 17/993,313

(22) Filed: Nov. 23, 2022

(65) Prior Publication Data

US 2023/0268182 A1    Aug. 24, 2023

(30) Foreign Application Priority Data

Feb. 18, 2022   (JP) ................... 2022-024161

(51) Int. Cl.
  *H01L 21/285*  (2006.01)
  *H10D 30/66*   (2025.01)
  *H10D 64/62*   (2025.01)

(52) U.S. Cl.
  CPC ..... *H01L 21/28518* (2013.01); *H10D 30/668* (2025.01); *H10D 64/62* (2025.01)

(58) Field of Classification Search
  CPC . H10D 30/668; H10D 64/62; H01L 21/28518
  USPC ....................................................... 257/330
  See application file for complete search history.

(56) References Cited

U.S. PATENT DOCUMENTS

| | | | |
|---|---|---|---|
| 7,781,322 B2 | 8/2010 | Ku et al. | |
| 8,513,094 B2 | 8/2013 | Miura | |
| 11,183,476 B2 | 11/2021 | Utsumi et al. | |
| 2012/0309191 A1* | 12/2012 | Miura ................. | C23C 14/352 |
| | | | 438/655 |

(Continued)

FOREIGN PATENT DOCUMENTS

| JP | 2003-068674 A | 3/2003 |
|---|---|---|
| JP | 2005-019943 A | 1/2005 |

(Continued)

OTHER PUBLICATIONS

Office Action issued on Jun. 3, 2025 in the corresponding Japanese patent application No. 2022-024161, w/ English Translation.

*Primary Examiner* — Igwe U Anya
(74) *Attorney, Agent, or Firm* — Rimon P.C.

(57) ABSTRACT

Disclosed is a technique for enhancing adhesion between a semiconductor substrate and a back surface electrode covering the back surface thereof. In particular, the enhancing adhesion technique includes: providing a semiconductor substrate SB having a main surface and a back surface opposite to the main surface, the back surface including n-type silicon; forming a first metal layer on the back surface of the semiconductor substrate SB, the first metal layer including nickel and vanadium which has a thermal diffusion coefficient smaller than that of nickel; performing a heat treatment to the semiconductor substrate to react silicon contained in the semiconductor substrate with nickel contained in the first metal layer to form a NiSiV layer in contact with the back surface of the semiconductor substrate; and forming a second metal including titanium on the NiSiV layer.

4 Claims, 18 Drawing Sheets

(56) References Cited

U.S. PATENT DOCUMENTS

| | | | | |
|---|---|---|---|---|
| 2016/0155640 | A1* | 6/2016 | Nakajima | H01L 21/0485 |
| | | | | 438/602 |
| 2020/0044031 | A1* | 2/2020 | Pham | H01L 24/05 |
| 2022/0246735 | A1* | 8/2022 | Renna | H10D 62/83 |

FOREIGN PATENT DOCUMENTS

| | | |
|---|---|---|
| JP | 2012-251214 A | 12/2012 |
| JP | 2017-168685 A | 9/2017 |
| JP | 2020-077833 A | 5/2020 |

\* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2022-024161 filed on Feb. 18, 2022, including the specification, drawings and abstract is incorporated herein by reference in its entirety.

BACKGROUND OF THE INVENTION

The present invention relates to a semiconductor device and a method of manufacturing the same, and for example, to a semiconductor device including an electrode on a back surface of a semiconductor substrate and a technique effective by being applied to the method of manufacturing the semiconductor device.

As the configuration of the back surface side of the electrode of the power device (power module) required high breakdown voltage, for example, Japanese unexamined Patent Application publication 2012-251214 discloses a stacked layer including nickel silicide layer, a titanium layer, a nickel layer and a gold layer in this order, on the back surface of the semiconductor substrate, and also discloses the back surface of the semiconductor substrate in contact with the electrode is made of n-type silicon.

SUMMARY OF THE INVENTION

With the miniaturization (high power density) and high junction temperature of the power device, the temperature change in the power cycle or the temperature cycle operation is also increased, the mechanical stress to each electrode joint due to the film stress tends to increase. As a request for the back surface electrode, improvement in adhesion of the back surface electrode is continuously required in order to suppress electrode separation.

As disclosed in Japanese unexamined Patent Application publication 2012-251214, when a titanium layer is formed in contact with a nickel silicide layer as a part of an electrode and a heat treatment for forming a titanium silicide is not performed, there is a problem that adhesion between the nickel silicide layer and the titanium film is low.

Other objects and novel features will become apparent from the description of this specification and the accompanying drawings.

The typical ones of the embodiments disclosed in the present application will be briefly described as follows.

A method of manufacturing a semiconductor device according to an embodiment comprising the steps of:
(a) providing a semiconductor substrate including a main surface and a back surface opposite to the main surface, the back surface including an n-type silicon;
(b) after the step (a), forming a first metal layer including a nickel and a first metal on the back surface of the semiconductor substrate, the first metal having a thermal diffusion coefficient smaller than that of the nickel;
(c) after the step (b), reacting the n-type silicon contained in the semiconductor substrate with the nickel contained in the first metal layer to form a silicide layer in contact with the back surface of the semiconductor substrate by performing a heat treatment on the semiconductor substrate; and
(d) after the step (c), forming a second metal layer including a second metal on the silicide layer.

A semiconductor device according to an embodiment comprising:
a semiconductor substrate including a main surface and a back surface opposite to the main surface, the back surface including an n-type silicon;
a silicide layer formed on the back surface of the semiconductor substrate, the silicide layer including nickel and a first metal; and
a second metal layer including a second metal formed on the silicide layer,
wherein the silicide layer has a first surface located on the semiconductor substrate side and a second surface located on the second metal layer side,
wherein the nickel is included in the first surface and the second surface of the silicide layer, and
wherein a ratio of the first metal included in the second surface of the silicide layer is greater than a ratio of the first metal included in the first surface.

According to one embodiment, the performance of semiconductor device can be improved. In particular, adhesion between the semiconductor substrate and the back electrode can be enhanced.

DETAILED DESCRIPTION

Figure 1:
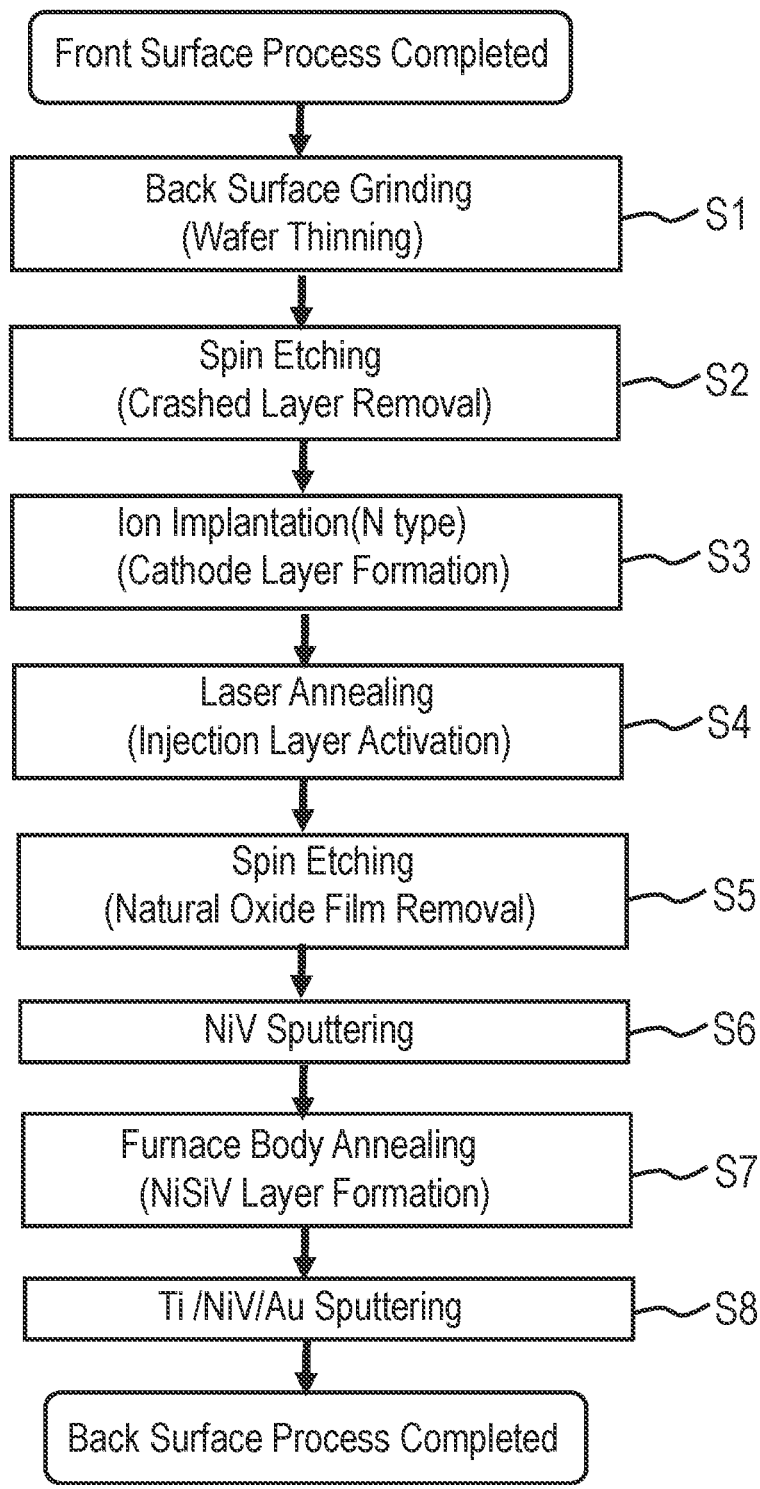
FIG. 1 is a flow chart showing a method of manufacturing a semiconductor device according to a first embodiment.

In the following embodiments, when required for convenience, the description will be made by dividing into a plurality of sections or embodiments. But except when specifically stated, they are not independent of each other, and one is a part of the other, or all of the other modifications, or is related to details or supplementary description. In addition, in the following embodiments, the number of elements or the like (including the number, the number, the amount, the range, and the like) is not limited to the mentioned number, except the case where it is specified in particular or the case where it is obviously limited to a specific number in principle, and may be equal to or more than the mentioned number or may be equal to or less than the mentioned number.

Furthermore, in the following embodiments, the constituent elements (including element steps and the like) are not necessarily essential except for the case in which they are specifically specified, the case in which they are considered to be obviously essential in principle, and the like. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

Further, as used herein, "−" and "+" are signs indicating the relative impurity concentration of n-type or p-type conductivity, for example, the impurity concentration of the n-type impurity increases in the order of "n$^{--}$", "n", "n$^{+}$", and the impurity concentration of the p-type impurity increases in the order of "p$^{--}$", "p", "p$^{+}$", "p$^{++}$".

<Details of Potential Improvement> In the following, details of the room for this improvement will be described with reference to the drawings.

As described in the problem to be solved by the invention, the power device has a large temperature change in a power cycle, a temperature cycle operation, or the like, so that there is a problem that electrode separation occurs due to mechanical stress, and improvement in adhesion of the back electrode is required.

Figure 18:
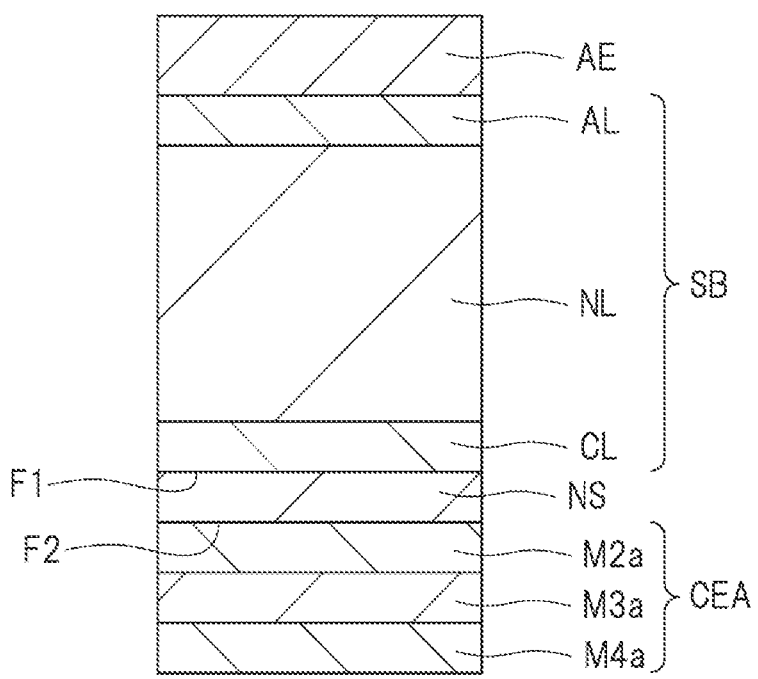
FIG. 18 is a cross-sectional view showing a semiconductor device according to a comparative example.

Here, FIG. 18 is a cross-sectional view of a semiconductor device of a comparative example. The semiconductor device shown in FIG. 18 is a power device including a diode, and includes a semiconductor board SB mainly made of single-crystal Si (silicon). The semiconductor board SB has a n$^-$ type semiconductor area NL, and includes a p-type anode layer AL formed on the main surface and a n$^+$ type cathode layer CL formed on the back surface. PN junction between the p-type anode layer AL and the n-type layer composed of n$^-$ type semiconductor-region NL and n$^+$ type cathode layer CL constitutes a diode. An anode electrode AE made of a metal layer is connected to an upper surface of the anode layer AL, and a back electrode CEA made mainly of a metal layer is connected to a lower surface of the cathode layer CL via a NiSi (nickel silicide) layer NS.

The back-electrode CEA is composed of a Ti (titanium) layer M2a, Ni (nickel) layer M3a and a Au (gold) layer M4a that are sequentially formed from SB of the semiconductor-substrate. Nisi layer is a silicide layer formed by depositing a metallic layer on the back surface of the semiconductor substrate SB by a sputtering method using a sputter target made of highly pure Ni (nickel, pure-Ni), and then heat treatment. That is, in the first surface F1, which is the bonding surface (interface) between the semiconductor board SB and NiSi layers NS, the bonding is formed by the semiconductor and the silicide. On the other hand, when NiSi layers NS and Ti layers M2a are bonded to each other, a heat treatment required for forming silicide (TiSi) is not performed. That is, in the second surface F2, which is a bonding surface (interface) between NiSi layers NS and Ti layers M2a, bonding is formed by Ti, Ni, Si.

Here, since the second surface F2 contains Si and the content of Si is relatively high, there is room for improving the adhesion between NiSi layer NS containing Ni and Ti layer M2a mainly made of Ti. When the adhesion between NiSi layers NS and Ti layers M2a is poor, the back-electrode CEA is easily peeled off from SB by dicing, chip picking-up, tape peeling, or the like.

Therefore, in the following embodiments, contrivance is made solve the above-described room for improvement. Hereinafter, the technical idea in the present embodiment to which the devise is applied will be described. That is, in the following, to reduce the ratio of Si in the second surface F2, by increasing the ratio of the metal, will be described to prevent peeling of the back electrode from the semiconductor substrate.

Hereinafter, a semiconductor device according to the present embodiment will be described with reference to FIGS. 1 to 7. FIG. 1 is a flowchart showing a method of manufacturing a semiconductor device according to the present embodiment. FIG. 2 to FIG. 7 are cross-sectional views showing a method of manufacturing the semiconductor device according to the present embodiment. Here, a method of manufacturing the semiconductor device according to the present embodiment will be described with reference to FIG. 2 to FIG. 7 with reference to the flowchart of FIG. 1.

Figure 2:
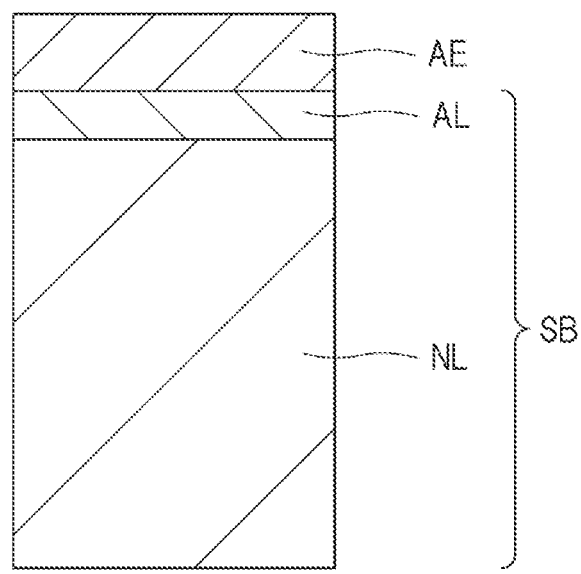
FIG. 2 is a cross-sectional view showing a method of manufacturing the semiconductor device according to the first embodiment.

Here, first, as shown in FIG. 2, a semiconductor substrate (semiconductor wafer) SB having completed the front-side step is prepared. The semiconductor-substrate SB includes a main surface (a first main surface and an upper surface) and a back surface (a second main surface and a lower surface) opposite to the main surface. The semiconductor board SB has a n$^-$ type semiconductor area NL and includes an anode layer AL which is a p-type semiconductor layer formed on a main surface. An anode AE made of a metallic layer is connected to an upper surface of the anode layer AL. The anode-electrode AE is made of, for example, AlSi (aluminum silicon), Al (aluminum), AlSiCu (aluminum silicon copper), or AlCu (aluminum copper). The anode layers AL and the anode electrode AE are formed by known manufacturing methods.

In the subsequent process, the manufacturing process is performed in a state in which the upper and lower portions of the semiconductor wafer are upside down, the main surface side is downwardly directed, and the back surface side is upwardly directed. However, a cross-sectional view used to explain the manufacturing process is shown without inverting the top and bottom. For this reason, for example, when the metal layer or the like is formed on the lower side of the back surface of SB in the drawing, the term "forming the metal layer on the back surface" may be used. This means that the metal-layer in contact with the exposed back surface of the semiconductor-substrate SB is formed so as to cover the back surface.

Figure 3:
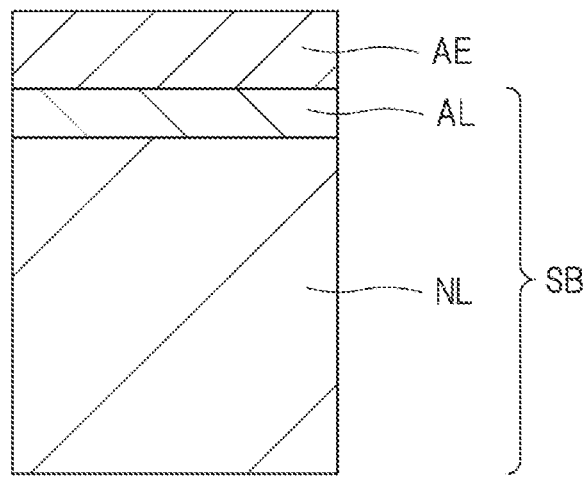
FIG. 3 is a cross-sectional view showing the method of manufacturing the semiconductor device following FIG. 2.

Next, as shown in FIG. 3, after BG (Back Grind) magnetic tape is attached to the main surface of the semiconductor wafer, the back surface of the semiconductor board SB is ground to reduce the thickness of the wafer (step S1). The back surface grinding thickness is set according to the breakdown voltage class, application, and design of the semiconductor device. For example, when the high-breakdown voltage product has a 600~1800V breakdown voltage, the thickness of the semiconductor-substrate SB is preferably 40 to 220 micrometers. After the grinding step, BG magnetic tape on the main surface of the wafer is peeled off.

Next, the crushed layers resulting from the grinding of the back surface of the step S1 are etched by spin-etching using mixed acid (step S2). The crushing layers consist mainly of Si. The back surface of the semiconductor-substrate SB is etched by spin-etching, for example, in a range of 2 to 20 μm, and more specifically, about 10 μm. Thus, the structure shown in FIG. 3 is obtained.

Figure 4:
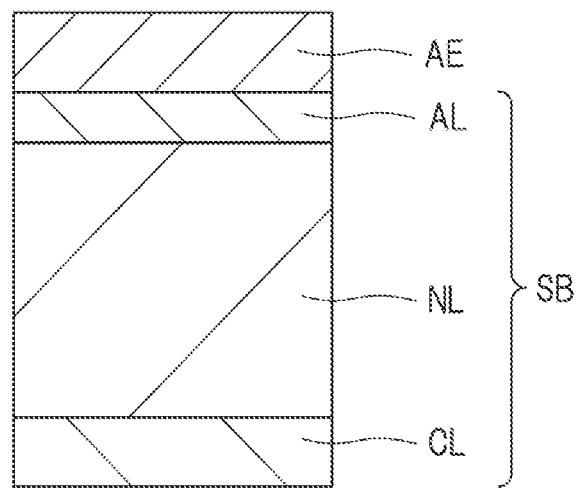
FIG. 4 is a cross-sectional view showing the method of manufacturing the semiconductor device following FIG. 3.

Next, as shown in FIG. 4, an impurity is introduced into the back surface of the semiconductor substrate SB by an ion-implantation method, thereby forming a cathode layer CL which is a n$^+$ type semiconductor layer (step S3). As the ion species of the ion implantation, P (phosphorus), As (arsenic) or Sb (antimony) can be considered. In order to form an ohmic junction between the back electrode and the cathode layer CL to be formed in a later step, the n-type impurity concentration of the n-type layer (cathode layer CL) on Si in contact with the back electrode needs to be $1\times10^{18}$~$1\times10^{21}$/cm$^3$. Therefore, the dose of the ion-implantation is preferably $1\times10^{14}$~$5\times10^{15}$/cm$^2$, and more preferably about $1\times10^{15}$/cm$^2$.

Next, the semiconductor-substrate SB is subjected to a heat treatment (activation annealing) (step S4). From the viewpoint of suppressing the thermal effect on the surface-structure of the anode layer AL, the anode electrode AE, and the like, it is preferable to activate impurities in the injection layer (cathode layer CL) by performing back surface local heating by laser annealing treatment. PN junction between the p-type anode layer AL and the n-type layer composed of n$^-$ type semiconductor regions NL and n type n$^-$ type cathode layer CL constitutes a diode as the semiconductor device. That is, semiconductor elements are formed on the semiconductor board SB. Thus, the structure shown in FIG. 4 is obtained.

Figure 5:
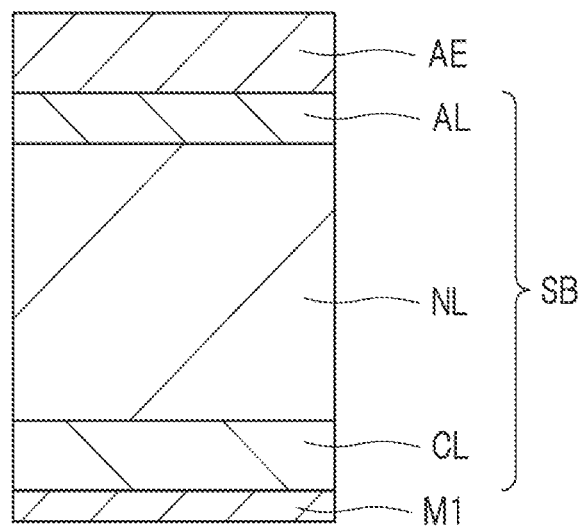
FIG. 5 is a cross-sectional view showing the method of manufacturing the semiconductor device following FIG. 4.

Next, as shown in FIG. 5, a natural oxide film (thickness 1 to 2 nm) covering the back surface of SB is removed by spin-etching using diluted hydrofluoric acid (step S5).

Next, the semiconductor substrate SB is placed in a sputtering device, and sputtering is performed using a Ni sputtering target containing V (vanadium), thereby forming a NiV layer (metal layer) M1 covering the back surface of the semiconductor substrate SB (step S6). If the thickness of NiV layers M1 is too thick, the wafer warps, and if the thickness is too thin, the silicide is formed in a subsequent S7 of steps. Therefore, the thickness of NiV layers M1 may be within 15~100 nm range, and specifically, 50 nm range is preferable. Further, the V contain of Ni sputtering target is about 2 to 10 wt %, specifically preferably about 7 wt %.

When the thickness of Ni sputtering target is increased, the magnetic properties thereof become stronger, and film formability at the time of sputtering is problematic, so that it is difficult to increase the thickness above a certain level. On the other hand, when V is added to Ni sputtering target, the effect of magnetism caused by increasing the thickness of Ni sputtering target can be reduced, so that the thickness of Ni sputtering target can be increased and the productivity of the device can be increased. As a result, the structure shown in FIG. 5 is obtained.

Figure 6:
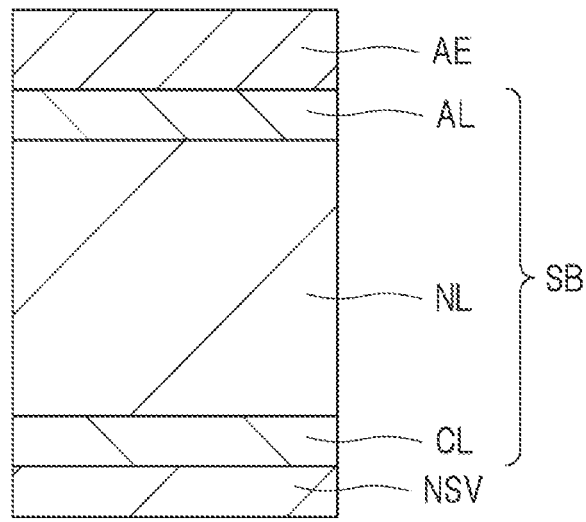
FIG. 6 is a cross-sectional view showing the method of manufacturing the semiconductor device following FIG. 5.

Next, as shown in FIG. 6, NiSiV layers NSV are formed by installing the semiconductor-substrate SB in the furnace body and performing the furnace body annealing (step S7). That is, by performing the heat treatment, Si on the back surface of the semiconductor substrate SB and NiV layer M1 react with each other to form a NiSiV layer NSV which is a silicide layer. NiSiV layer NSV is a nickel silicide layer containing V. The annealing conditions here are in the range of 350° C., 1 to 30 min, and the annealing time is specifically 10 min degree is preferred. If the annealing time is too long, NiSiV layers NSV may be silicon-rich, and the warpage of SB of the semiconductor-substrate may increase. The annealing may be performed only by $N_2$ (nitrogen), but may also include $H_2$ (hydrogen). Further, regarding the silicide formation, not the furnace body annealing but the lamp heating in the sputtering apparatus or the backside local heating by the laser annealing apparatus may be performed. When the thickness of NiV layer M1 is 50 nm, the annealing condition of the step S7 is 350° C., and 10 min, the thickness of NiSiV layer NSV is about 200 nm. As a result, the structure shown in FIG. 6 is obtained.

Figure 7:
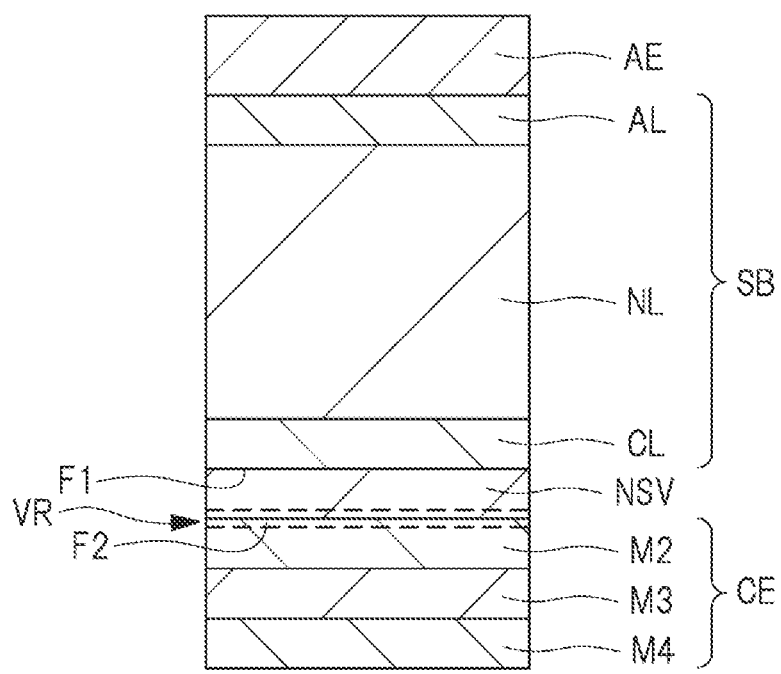
FIG. 7 is a cross-sectional view showing the method of manufacturing the semiconductor device following FIG. 6.

Next, as shown in FIG. 7, the electrode films of Ti (titanium) layer M2, NiV (nickel vanadium) layer M3 and Au (gold) layer M4 are sequentially formed on NiSiV layer NSV by a sputtering method or the like, thereby forming the back surface electrode CE (step S8). Here, after Ti layers M2 are formed on NiSiV layers NSV, the heat treatment required for forming silicide (TiSi) is not performed. The back-electrode CE includes Ti layers M2, NiV layers M3 and Au layers M4 sequentially formed from SB of the semiconductor-substrate. As described above, the back-electrode CE has a stacked-layer configuration including a plurality of metallic layers (Ti layers M2, NiV layers M3 and Au layers M4).

NiV layers M3 may be Ni (nickel) layers. Au layers M4 may be Ag (silver) layers. The thickness of Au layers M4 may be, for example, a range of 50~200 nm, but the thickness of Ag layers is preferably a range of 500~1500 nm, and the specific thickness of Ag layers is preferably about 1000 nm. As described above, the back surface process is completed, and the semiconductor device of the present embodiment is almost completed.

Figure 8:
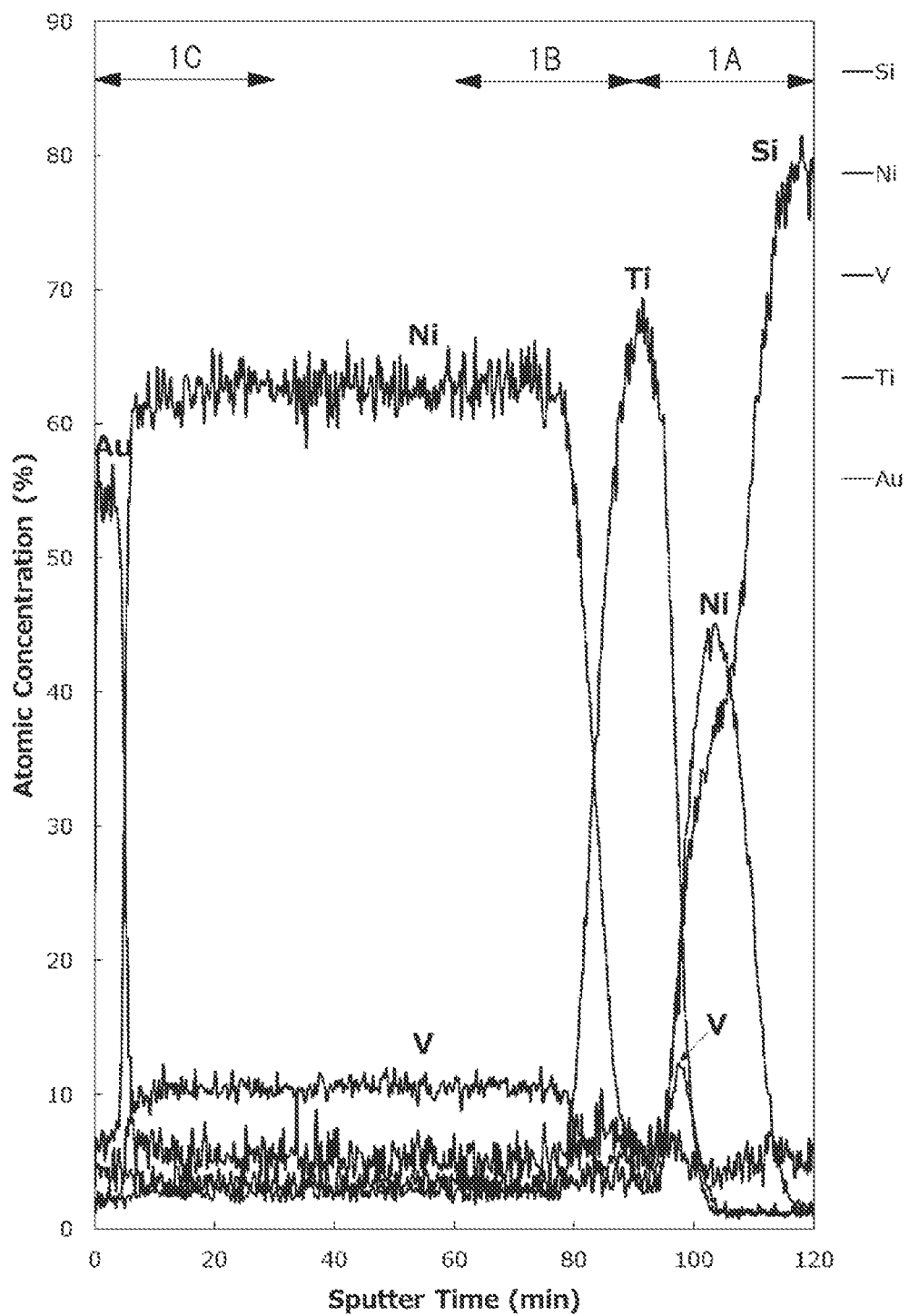
FIG. 8 is a graph showing a composition in the vicinity of a back surface electrode of the semiconductor device according to the first embodiment.

FIG. 8 is a graph showing the composition of a constituent part of the semiconductor device of the present embodiment extending from the lower end of the back electrode to the inside of the semiconductor substrate near the back electrode. FIG. 8 is a graph showing a composition-ratio detected by AES (Auger electron spectroscopy, Auger Electron Spectroscopy). AES is a technique to analyze the constituent elements of the sample surface and their chemical bond states by irradiating the sample surface with a narrow electron beam and measuring the kinetic energy of Auger electrons emitted from the sample surface. Here, the composition of the element is graphed from the spectral information obtained by repeating the sputtering and the measurement alternately. The sputtering rate is 10 nm/min (in terms of $SiO_2$).

The vertical axis of the graph shown in FIG. 8 represents the element ratio (concentration of each element), and the horizontal axis represents the sputtering time. The longer the sputtering time, the deeper the composition can be detected from the sample surface. Here, AES is measured from the back surface side of the device shown in FIG. 7, that is, from the bottom surface side of the back surface CE. Therefore, the horizontal axis represents Au layer M4, NiV layer M3, Ti layer M2, NiSiV layer NSV and the semiconductor-substrate SB in order from the left side to the right side.

Here, AES is graphed only a total of 5 elements of metal (Ni, V, Ti, Au) and Si, but actually C (carbon), O (oxygen), P (phosphorus) is also detected, the element ratio of the vertical axis is not 5 elements, it represents those calculated from 8 elements (all elements detected).

Figure 9:
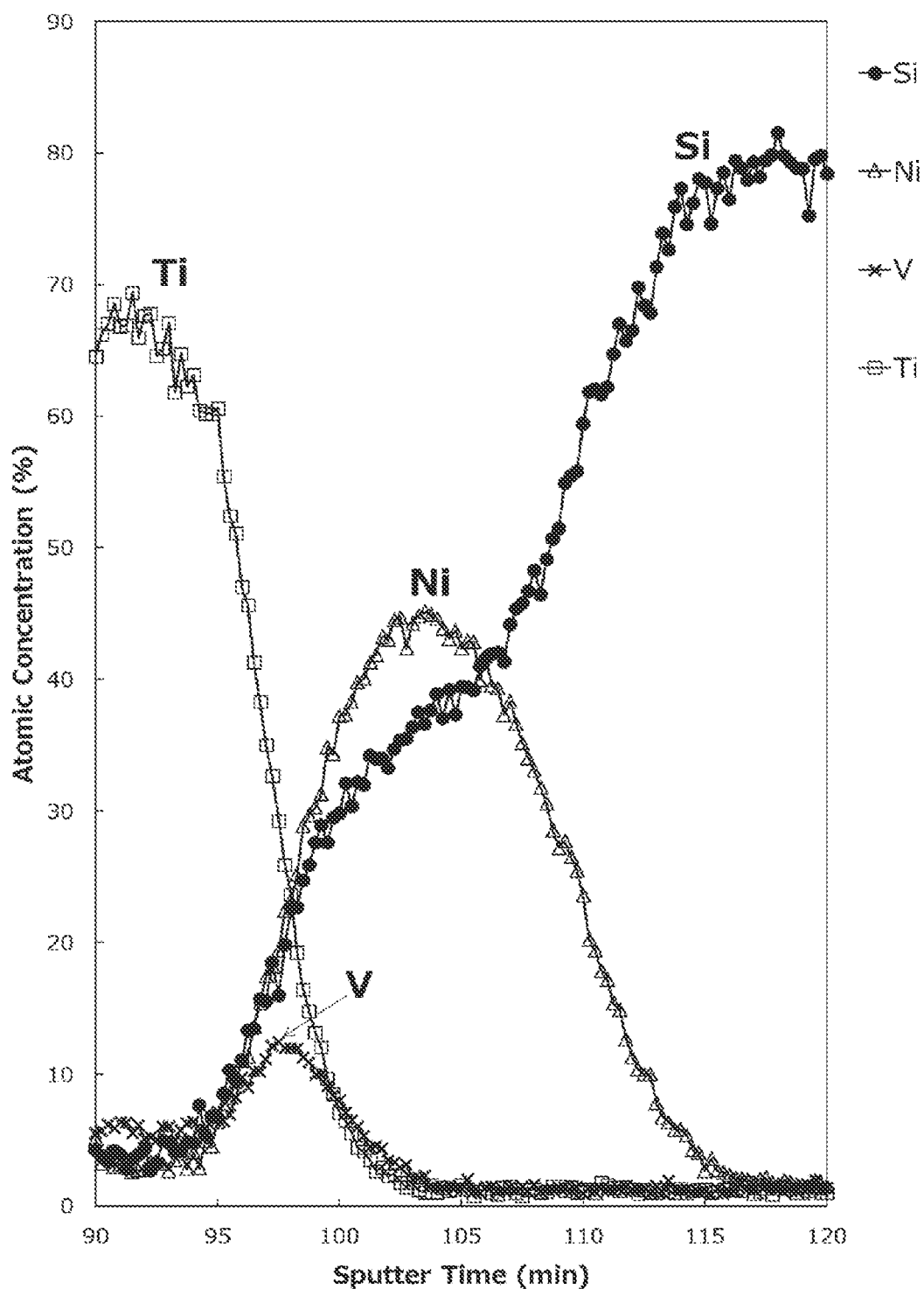
FIG. 9 is an enlarged view of a portion of FIG. 8.
Figure 10:
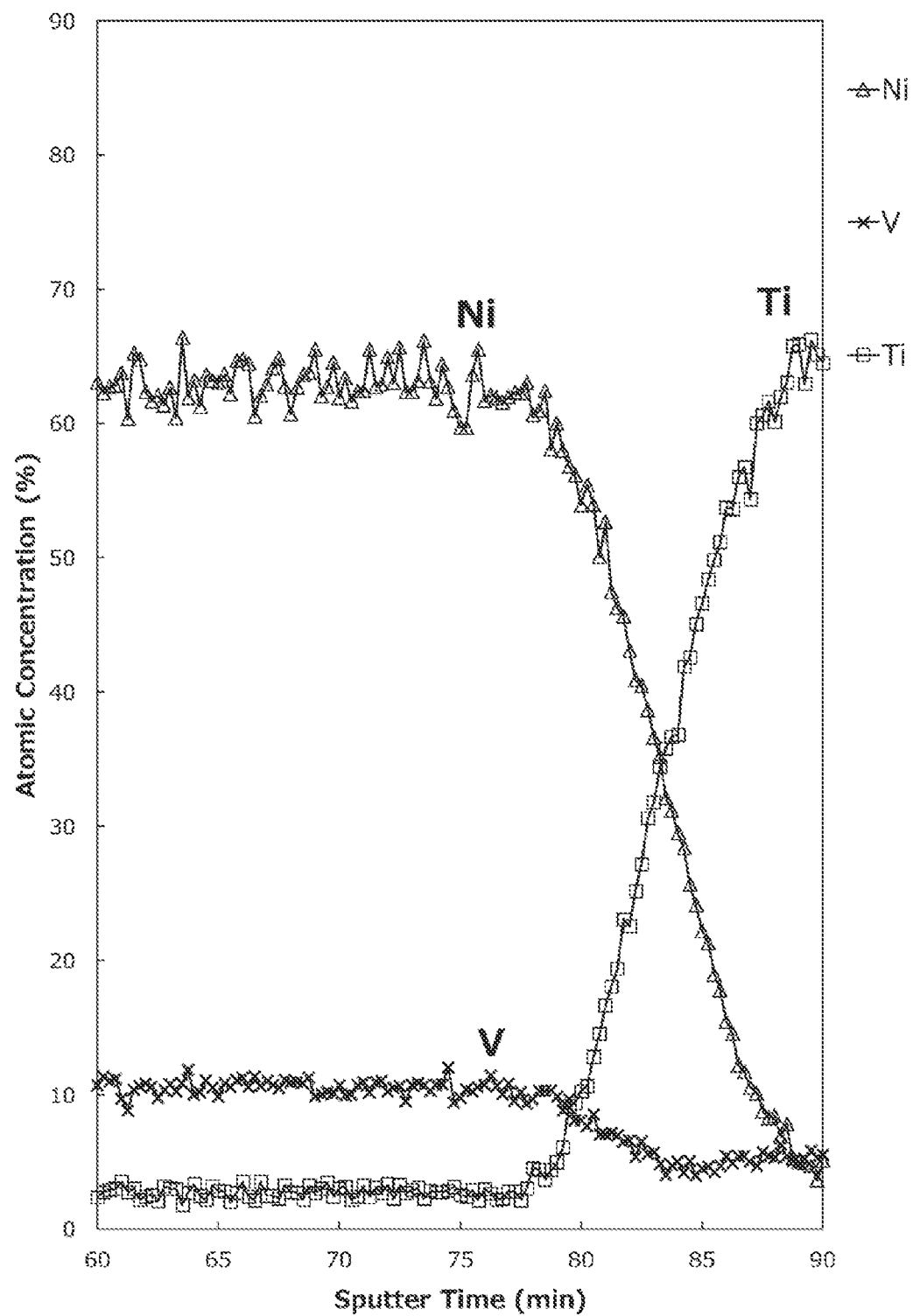
FIG. 10 is an enlarged view of a portion of FIG. 8.
Figure 11:
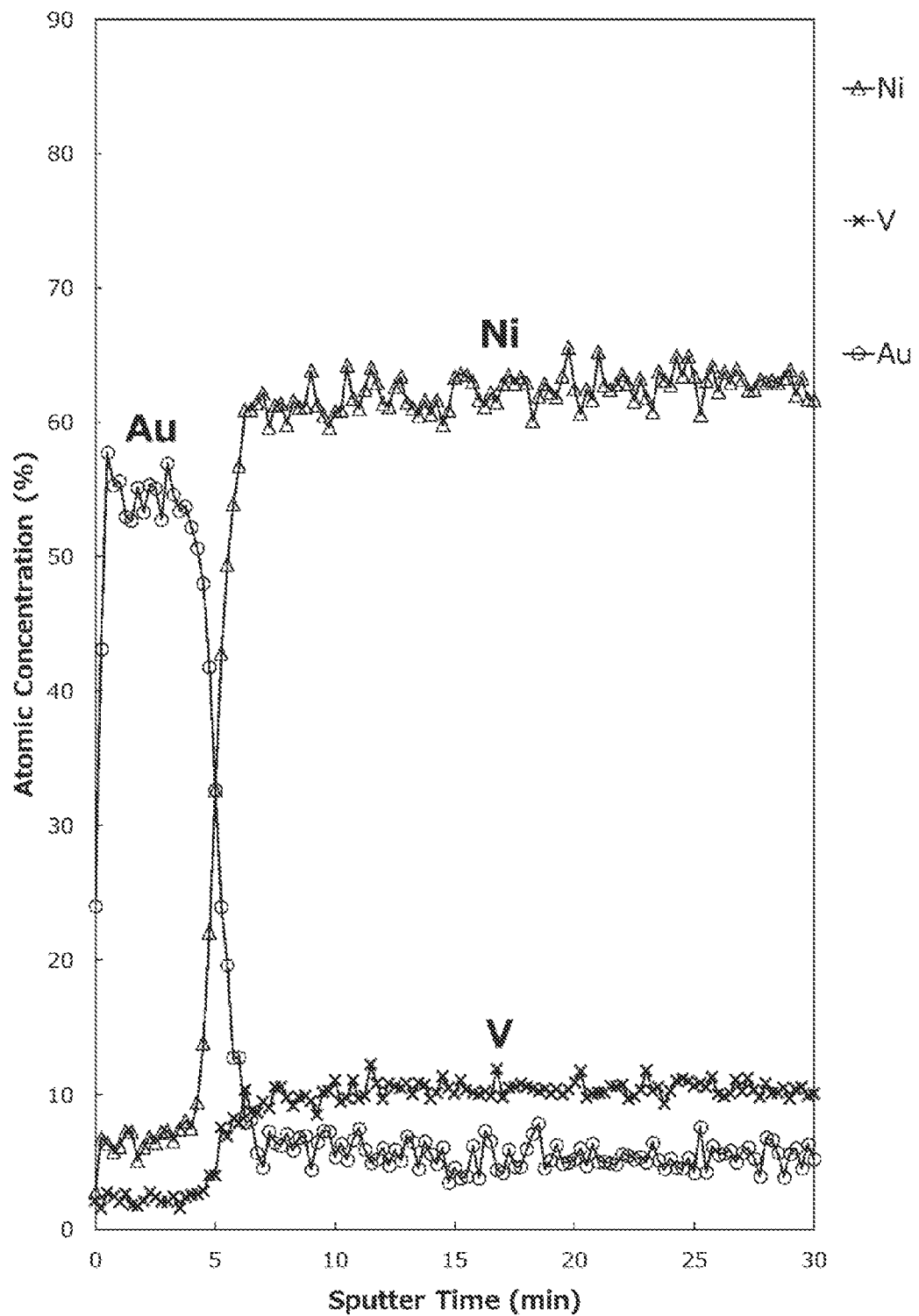
FIG. 11 is an enlarged view of a portion of FIG. 8.

For the sake of clarity, FIG. 9 shows a graph of a range 1A in which the time on the horizontal axis of the graph is 90~120 min, FIG. 10 shows a graph of a range 1B in which the time on the horizontal axis is 60~90 min, and FIG. 11 shows a graph of a range 1C in which the time on the horizontal axis is 0 to 30 min. FIG. 9 is a graph showing a ratio (composition) of an interface (second surface F2) between Ti layers M2 and NiSiV layers NSV and a vicinity of an interface (first surface F1) between NiSiV layers NSV and the semiconductor-substrate SB. FIG. 10 is a graph showing the composition in the vicinity of the interface between NiV layers M3 and Ti layers M2. FIG. 11 is a graph showing the composition in the vicinity of the interface between Au layers M4 and NiV layers M3.

In FIG. 9, the percentage of Si is represented by a plot of black circles, the percentage of Ni is represented by a plot of white triangles, the percentage of V is represented by a plot of cross marks, and the percentage of Ti is represented by a plot of white squares. In FIG. 10, the percentage of Ni is represented by a plot of white triangles, the percentage of V is represented by a plot of cross marks, and the percentage of Ti is represented by a plot of white squares. In FIG. 11, the percentage of Ni is represented by a plot of white triangles, the percentage of V is represented by a plot of cross marks, and the percentage of Au is represented by a plot of white circles.

One of the main features of the present embodiment is that V is segregated in the vicinity of the second surface F2 and the second surface F2, which are the interfaces between Ti layers M2 and NiSiV layers NSV, as indicated by arrows in FIG. 9. In FIG. 7, a region VR sandwiched by two broken lines is shown, and V is segregated in the region VR including the second surface F2. Accordingly, when the metals (Ni and V) are uniformly dispersed in NiSiV layers NSV and when V is not present in NiSiV layers NSV, the ratio (concentration, composition ratio) of the metals in the second surface F2 of NiSiV layers NSV becomes relatively high, and the ratio (concentration, composition ratio) of Si becomes low. Therefore, the adhesion between Ti layers M2 and NiSiV layers NSV, which are metallic layers, can be enhanced.

In the present embodiment, V is contained in a Ni sputtering target used in a sputtering process (step S6) for forming a NiV layer M1 which is a metallic layer for reaction to be formed in order to form a silicide layer (NiSiV layer NSV). As a result, V is segregated in the second surface F2.

Here, the diffusion coefficient (in Silicon) D of V (interstitial vanadium) is expressed by $D=10^{-9} \sim 10^{-10}$ cm$^2$s$^{-1}$ (800° C.). On the other hand, the diffusion coefficient (in Silicon) D of Ni is expressed as $D=\sim 10^{-5}$ cm$^2$s$^{-1}$ (800° C.). Therefore, the diffusion coefficient of V is much smaller than the diffusion coefficient of Ni. Since the difference in diffusion coefficient between Ni and V is large, Ni diffuses when NiSiV layers NSV are formed, but the diffusion distance of V is very small, resulting in segregation of V in the second surface F2.

The metal to be segregated is not limited to V, and may be a metal having a diffusivity smaller than that of Ni. Metals having a lower diffusivity than Ni like V include Mn (manganese), Fe (iron), Cr (chromium), Ru (ruthenium), Ti, Mo (molybdenum), W (tungsten), and Ta (tantalum).

As described above, in the present embodiment, V is segregated in the second surface F2, which is the interface between Ti layers M2 and NiSiV layers NSV shown in FIG. 7, so that the adhesion between the back surface of SB and the back electrode CE can be enhanced. That is, the performance of the semiconductor device can be improved. As described above, according to the present embodiment, it is possible to eliminate the room for the above-described improvement.

Further, as shown in FIG. 9, V is hardly dispersed in the first surface F1, which is an interface between NiSiV layers NSV and the semiconductor-substrate SB. In other words, the ratio (concentration, composition ratio) of V in the first surface F1 is smaller than the ratio (concentration, composition ratio) of V in the second surface F2. As a result, the adhesion between NiSiV layers NSV on the first surface F1 and the semiconductor-substrate SB is not reduced, and the adhesion on the second surface F2 can be enhanced.

On the other hand, as shown in FIGS. 10 and 11, V is uniformly diffused in NiV layers M3. Therefore, NiV layers M3 can be highly adhered to both Ti layers M2 as the metal layers and Au layers M4 as the metal layers.

Although a semiconductor device including a diode has been described in the above embodiment, the semiconductor element formed on the semiconductor substrate is not limited to a diode as long as it has an n-type semiconductor layer on the back surface of the semiconductor substrate.

Hereinafter, a semiconductor device including a power MOSFET (Metal Oxide Semiconductor Field Effect Transistor, MOS field-effect transistor) as the semiconductor device of the present embodiment will be described. The power MOSFET is a semiconductor device capable of handling power of several watts or more. The semiconductor device of the present application includes a trench gate type MOSFET of the power MOSFET. The trench gate type MOSFET includes a gate electrode made of polysilicon or the like in a trench (a relatively long narrow trench) formed in an upper surface (first main surface) of a semiconductor substrate, and channels are formed in the thickness of the semiconductor substrate. In this case, usually, the main surface side of the semiconductor substrate serves as a source, and the back surface side serves as a drain.

Figure 12:
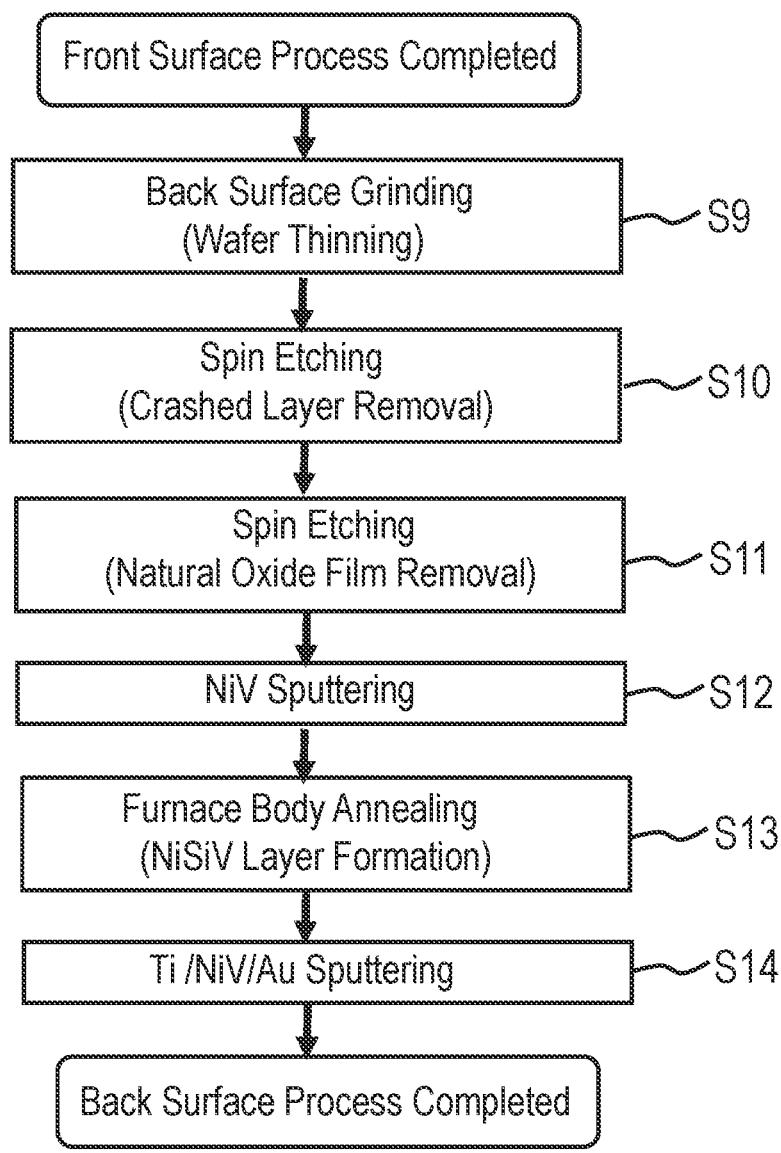
FIG. 12 is a flow chart showing a method of manufacturing a semiconductor device according to a second embodiment.

Hereinafter, the semiconductor device of the present embodiment will be described with reference to FIGS. 12 to 17. FIG. 12 is a flowchart illustrating a method of manufacturing the semiconductor device according to the present embodiment. FIG. 13 to FIG. 17 are cross-sectional views illustrating a method of manufacturing the semiconductor device according to the present embodiment. Here, a method of manufacturing the semiconductor device according to the present embodiment will be described with reference to FIG. 13 to FIG. 17 with reference to the flow of FIG. 12.

Figure 13:
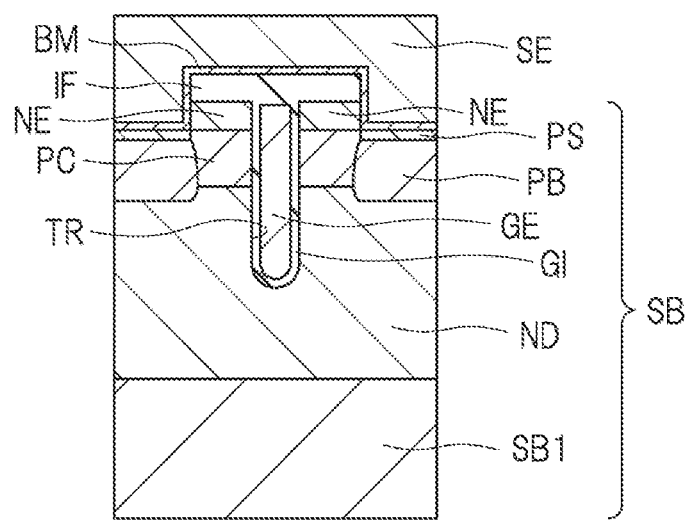
FIG. 13 is a cross-sectional view showing a method of manufacturing a semiconductor device according to the second embodiment.

Here, first, as shown in FIG. 13, a semiconductor substrate (semiconductor wafer) SB having completed the front-side step is prepared. The semiconductor-substrate SB includes a main surface and a back surface opposite to the main surface. A trench gate type MOSFET is formed in SB.

As shown in FIG. 13, the semiconductor substrate SB is a stacked semiconductor substrate including a substrate SB1 and an epitaxial layer (semiconductor layer) formed on the substrate SB1 by an epitaxial growth method. A n⁻ type layer ND is formed on the semiconductor-substrate SB, and n type layer ND constitutes a drifting layer of MOSFET.

A pair of n⁻ type layer ND on the main surface-side semiconductor substrate SB is formed with a pair of p⁺ type layer PB arranged laterally, and a pit type layer PB is formed on the semiconductor substrate SB immediately above each of the pair of p$^+$ type layer PB. Further, a pair of p-type layer PC is formed on the semiconductor-substrate SB between the pair of p$^+$ type layer PB. p$^+$ type layer PB and the p type layer PC constitute a body area of MOSFET. p$^{++}$ type layer PS is a high-concentration semiconductor layer for reducing p$^+$ type layer PB and the source electrode SE electrically connected to each other, and p$^{++}$ type layer PS is ohmically connected to the source electrode SE.

A n$^+$ type layer NE is formed on the semiconductor-substrate SB immediately above each of the pair of p-type layer PC. n$^+$ layer-type NE constitutes a source-region of MOSFET. Between each of the pair of n$^+$ type layer NE and between each of the pair of p type layer PC, one trench TR is formed, and the trench TR extends from the height of the upper surface of n$^+$ type layer NE (the main surface of the semiconductor-substrate SB) to the intermediate depth of n$^-$ type layer OOH. A gate electrode GE is formed inside the trench TR via a gate insulating film GI.

The gate insulating film GI is made of, for example, SiO$_2$ (silicon oxide), and the gate electrode GE is made of, for example, polycrystalline Si. The gate electrode GE is insulated from n$^+$ type layer NE, the p type layer PC, and n type layer ND by the gate insulating film GI. The epitaxial layer is a semiconducting layer including a n$^+$ type layer ND, p$^+$ type layer PB, a p type layer PC, p$^{++}$ type layer PS, and a n$^+$ type layer NE.

An insulating film GE is formed so as to cover the upper surface of the gate electrode SE and the upper surface of n$^+$ type layer NE, and a source electrode p$^{++}$ is formed so as to cover p$^{++}$ type layer PS, n$^+$ type layer NE and the insulating film IF via the barrier metal film BM. The insulating film IF is made of, for example, silicon oxide, the barrier metal film BM is made of, for example, TiW (titanium-tungsten), and the source-electrode SE is made of, for example, AlSi, Al, AlSiCu or AlCu. The barrier metal film BM is in contact with the upper surface of p$^{++}$ type layer PS and the side surface of n$^+$ type layer NE. As a result, p$^{++}$ type layers PS and n$^+$ type layers NE are electrically connected to the source-electrode SE.

The substrate SB1 constituting the back surface of the semiconductor substrate SB is a n$^+$ type layer, and constitutes the drain-region of MOSFET. The trench gate type MOSFET of the present embodiment includes at least a gate electrode GE, a n$^+$ type layer NE as a source region, a substrate SB1 as a drain region, and a p type layer PC as a body region. The trench gate type MOSFET is formed by a well-known manufacturing process.

In the subsequent process, the manufacturing process is performed in a state where the upper and lower portions of the semiconductor wafer are upside down. However, a cross-sectional view used to explain the manufacturing process is shown without inverting the top and bottom. For this reason, for example, when the metal layer or the like is formed on the lower side of the back surface of SB in the drawing, the term "forming the metal layer on the back surface" may be used.

Figure 14:
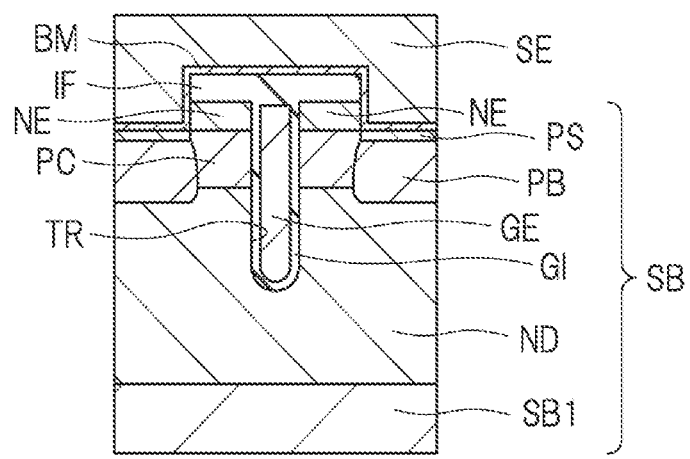
FIG. 14 is a cross-sectional view showing the method of manufacturing the semiconductor device following FIG. 13.

Next, as shown in FIG. 14, after BG strip is attached to the main surface of the semiconductor wafer, the back surface of the semiconductor board SB is ground to reduce the thickness of the wafer (step S9). The back surface grinding thickness is set according to the application and design of the semiconductor device (such as on-resistance or warpage of the wafer). Here, only the base SB1 is ground and the epitaxial layers are not ground. Therefore, the grinding thickness is not a breakdown voltage, but an appropriate thickness is set in consideration of on-resistance, warpage of the wafer, or the like. The thickness of the ground SB1 is, for example, about 50~300 μm. After the grinding step, BG magnetic tape on the main surface of the wafer is peeled off.

Next, the crushed layers resulting from the grinding of the back surface of the step S9 are etched by spin-etching using mixed acid (step S10). The crushing layers consist mainly of Si. The back surface of the semiconductor-substrate SB is etched by spin-etching, for example, in a range of 2 to 20 μm, and more specifically, about 10 μm. Thus, the structure shown in FIG. 14 is obtained.

Figure 15:
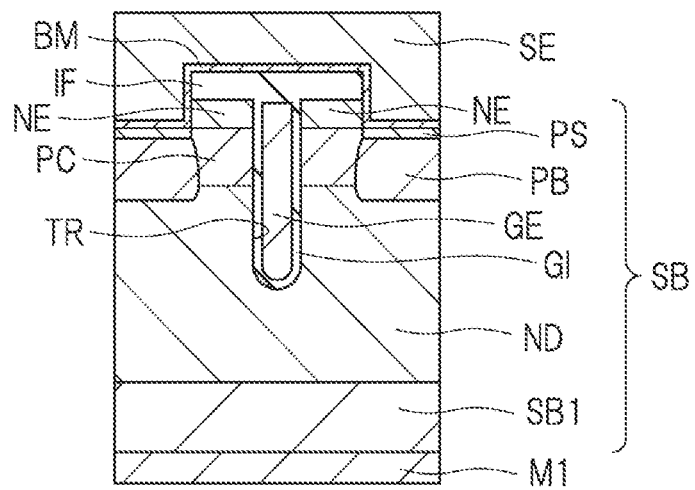
FIG. 15 is a cross-sectional view showing the method of manufacturing the semiconductor device following FIG. 14.

Next, as shown in FIG. 15, a natural oxide film (thickness 1 to 2 nm) covering the back surface of SB is removed by spin-etching using diluted hydrofluoric acid (step S11).

Next, the semiconductor substrate 3 is placed in a sputtering device, and sputtering is performed using a Ni sputtering target containing V (vanadium), thereby forming a NiV layer (metal layer) M1 covering the back surface of the semiconductor substrate SB (step S12). If the thickness of NiV layers M1 is too thick, the wafer warps, and if the thickness is too thin, the silicide is formed in a subsequent S13 of steps. Therefore, the thickness of NiV layers M1 may be within 15~100 nm range, and specifically, 50 nm range is preferable. Further, the V contain of Ni sputtering target is about 2 to 10 wt %, specifically preferably about 7 wt %. Thus, the structure shown in FIG. 15 is obtained.

Figure 16:
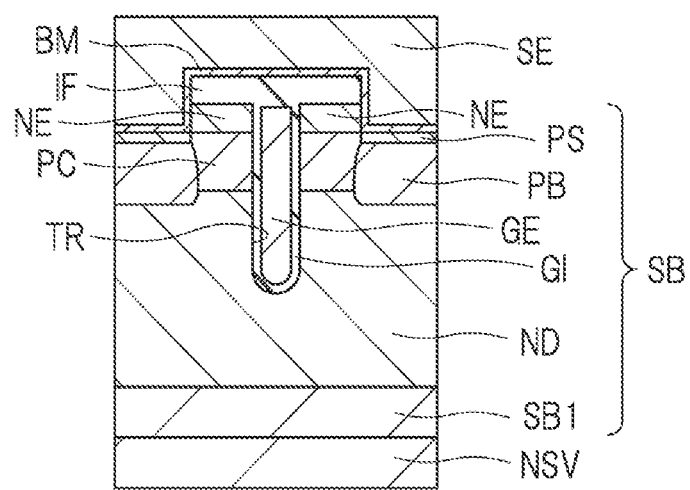
FIG. 16 is a cross-sectional view showing the method of manufacturing the semiconductor device following FIG. 15.

Next, as shown in FIG. 16, NiSiV layers NSV are formed by installing the semiconductor-substrate SB in the furnace body and performing the furnace body annealing (step S13). That is, by performing the heat treatment, Si on the back surface of the semiconductor substrate SB and NiV layer M1 react with each other to form a NiSiV layer NSV which is a silicide layer. NiSiV layer NSV is a nickel silicide layer containing V. The annealing conditions here are in the range of 350° C., 1 to 30 min, and the annealing time is specifically 10 min degree is preferred. If the annealing time is too long, NiSiV layers NSV may be silicon-rich, and the warpage of SB of the semiconductor-substrate may increase. The annealing may be performed only by N$_2$, but may additionally include H$_2$. Further, regarding the silicide formation, not the furnace body annealing but the lamp heating in the sputtering apparatus or the backside local heating by the laser annealing apparatus may be performed. When the thickness of NiV layer M1 is 50 nm, the annealing condition of the step S13 is 350° C., and 10 min, the thickness of NiSiV layer NSV is about 200 nm. Thus, the structure shown in FIG. 16 is obtained.

Figure 17:
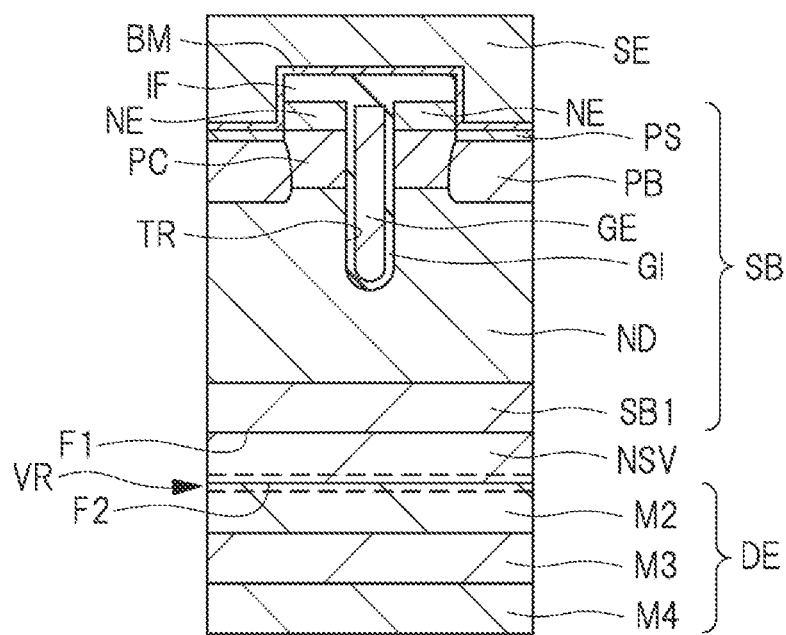
FIG. 17 is a cross-sectional view showing the method of manufacturing the semiconductor device following FIG. 16.

Next, as shown in FIG. 17, the electrode films of Ti (titanium) layer M2, NiV (nickel vanadium) layer M3 and Au (gold) layer M4 are sequentially formed on NiSiV layer NSV by a sputtering method or the like, thereby forming the back surface electrode DE (step S14). Here, after Ti layers M2 are formed on NiSiV layers NSV, the heat treatment required for forming silicide (TiSi) is not performed. The back-electrode DE includes Ti layers M2, NiV layers M3 and Au layers M4 sequentially formed from SB of the semiconductor-substrate. NiV layers M3 may be Ni (nickel) layers. Au layers M4 may be Ag (silver) layers. The thickness of Au layers M4 may be, for example, a range of 50~200 nm, but the thickness of Ag layers is preferably a range of 500~1500 nm, and the specific thickness of Ag layers is preferably about 1000 nm. As described above, the back surface process is completed, and the semiconductor device of the present embodiment is almost completed.

As in the present embodiment, in the semiconductor device including the vertical MOSFET, V is segregated in the region VR including the second surface F2, which is the interface between Ti layers M2 and NiSiV layers NSV, so that the same advantages as those of the first embodiment can be obtained. That is, the adhesion between the back surface of the semiconductor board SB and the back electrode DE can be increased, and the performance of the semiconductor device can be improved.

Although the invention made by the present inventor has been specifically described based on the embodiment, the present invention is not limited to the as described above embodiment, and it is needless to say that various modifications can be made without departing from the gist thereof.

What is claimed is:

1. A method of manufacturing a semiconductor device, the method comprising:
    (a) providing a semiconductor substrate including a main surface and a back surface opposite to the main surface, the back surface including an n-type silicon;
    (b) after the (a), forming a first metal layer including nickel and vanadium on the back surface of the semiconductor substrate, the vanadium having a thermal diffusion coefficient smaller than that of the nickel;
    (c) after the (b), reacting the n-type silicon contained in the semiconductor substrate with the nickel contained in the first metal layer to form a silicide layer in contact with the back surface of the semiconductor substrate by performing a heat treatment on the semiconductor substrate;
    (d) after the (c), forming a second metal layer including a second metal on the silicide layer; and
    (e) after the (d), forming a third metal layer including nickel and vanadium,
    wherein in the (b), the first metal layer is formed by a sputtering method using a Ni sputtering target containing the vanadium,
    wherein a ratio of the vanadium on a second surface that is an interface between the second metal layer and the silicide layer is greater than a ratio of the vanadium on a first surface that is an interface between the silicide layer and the semiconductor substrate, and
    wherein the vanadium is uniformly diffused in the third metal layer.

2. The method according to claim 1, wherein the second metal includes titanium.

3. The method according to claim 1, further comprising: a step of forming a fourth metal layer including Au.

4. A semiconductor device comprising:
    a semiconductor substrate including a main surface and a back surface opposite to the main surface, the back surface including an n-type silicon;
    a silicide layer formed on the back surface of the semiconductor substrate, the silicide layer including nickel and a first metal;
    a second metal layer including a second metal formed on the silicide layer; and
    a third metal layer including nickel and vanadium formed on the second metal layer,
    wherein the silicide layer has a first surface located on the semiconductor substrate side and a second surface located on the second metal layer side,
    wherein the nickel is included in the first surface and the second surface of the silicide layer,
    wherein a ratio of the first metal included in the second surface of the silicide layer is greater than a ratio of the first metal included in the first surface, and
    wherein the vanadium is uniformly diffused in the third metal layer.

* * * * *